US006323578B1

United States Patent
Suzuki et al.

(10) Patent No.: US 6,323,578 B1
(45) Date of Patent: Nov. 27, 2001

(54) PIEZOELECTRIC ACTUATOR, PIEZOELECTRIC ACTUATOR DRIVING METHOD AND COMPUTER READABLE STORAGE MEDIUM STORED WITH PROGRAM FOR MAKING COMPUTER EXECUTE PIEZOELECTRIC ACTUATOR DRIVING METHOD

(75) Inventors: Mizuaki Suzuki; Hidetaka Maeda; Kazuo Tani; Yoko Suzuki, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/478,239

(22) Filed: Jan. 4, 2000

(30) Foreign Application Priority Data

Jan. 5, 1999 (JP) .................................................. 11-000356

(51) Int. Cl.$^7$ ................................................. H01L 41/08
(52) U.S. Cl. ....................................................... 310/323.02
(58) Field of Search .................... 310/323.02, 323.12, 310/316.01, 316.02

(56) References Cited

U.S. PATENT DOCUMENTS 4,742,260 * 5/1988 Shimizu et al. ................. 310/323.02
6,072,266 * 6/2000 Tomikawa ........................ 310/323.02
6,104,122 * 8/2000 Ishimaru ........................... 310/323.02
6,201,339 * 3/2001 Tani et al. ............................. 310/328

FOREIGN PATENT DOCUMENTS 04029576   1/1992  (JP) .
05067194   9/1993  (JP) .
06277624   10/1994 (JP) .
10337059   12/1998 (JP) .

* cited by examiner

Primary Examiner—Mark O. Budd
(74) Attorney, Agent, or Firm—Adams & Wilks

(57) ABSTRACT

A piezoelectric actuator has a rotational moving member and a supporting member disposed opposite to the rotational moving member and having cantilever portions. Each of the cantilever portions of the supporting member has a fixed end and a free end opposite to the fixed end for contacting the rotational moving member when the supporting member is oscillated. A piezoelectric member is disposed on a respective one of the cantilevers of the supporting member. A power source supplies a voltage to each of the piezoelectric members to oscillate the supporting member in a vibration mode higher than a secondary mode of vibration so that the free ends of the cantilevers make sufficient contact with the rotational moving member to thereby rotate the rotational moving member.

20 Claims, 7 Drawing Sheets

(PZT) PIEZOELECTRIC BODY (PZT CERAMICS)

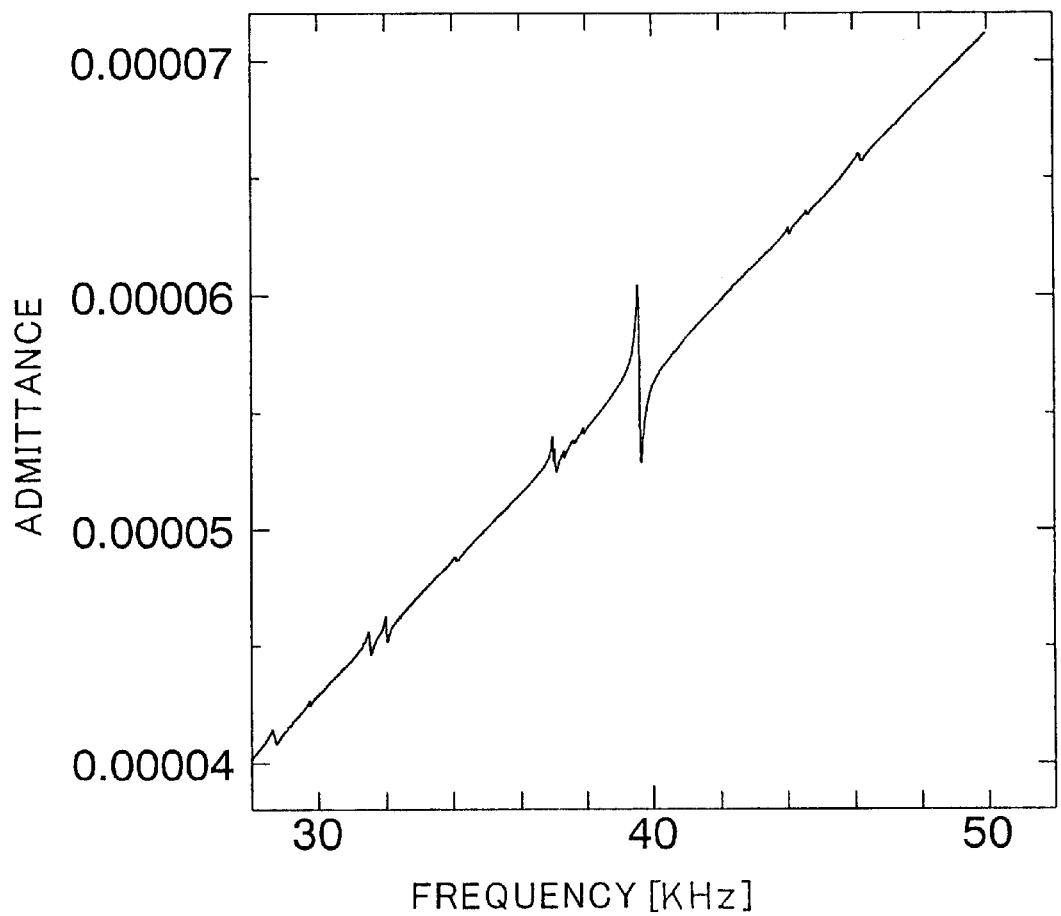
F I G. 5

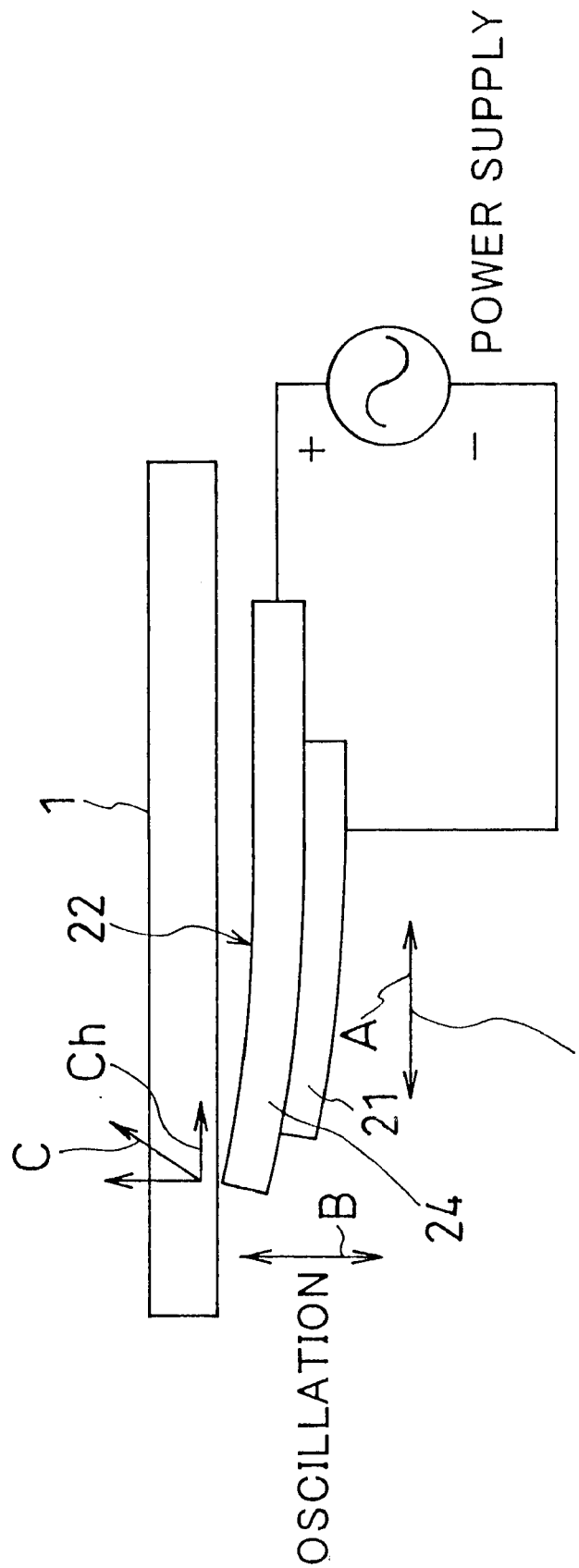

PIEZOELECTRIC ACTUATOR, PIEZOELECTRIC ACTUATOR DRIVING METHOD AND COMPUTER READABLE STORAGE MEDIUM STORED WITH PROGRAM FOR MAKING COMPUTER EXECUTE PIEZOELECTRIC ACTUATOR DRIVING METHOD

BACKGROUND OF THE INVENTION

The present invention relates to a piezoelectric actuator capable of efficiently moving a moving member, a method of driving a piezoelectric actuator and a computer readable storage medium stored with a program for making a computer execute a method of driving a piezoelectric actuator.

Currently, downsizing of OA apparatus and information processing apparatus has been progressed. In accordance therewith, attention is attracted to a piezoelectric actuator as a power supply used for driving and transferring. As an example of such a piezoelectric actuator, there is known an ultrasonic motor of a progressive wave type applying elongation and contraction operation on a piezoelectric element.

A progressive wave type ultrasonic motor is constituted by a stator and a rotor in a ring-like shape as shown by "Introduction to Ultrasonic Motor" by Kenjo, Shidacho, p.7, edited by Sogo Densi Shuppan. A piezoelectric oscillator comprising PZT ceramic is bonded onto a rear face of the stator by an adhering agent to thereby oscillate integrally therewith.

The piezoelectric member in the ring-like shape is divided into a plurality of small regions which are respectively polarized in directions alternately opposed to each other to produce a flexural wave of a progressive wave (refer to drawings at pp. 11 and 197 of the cited literature). Further, in order to apply sine wave voltages accompanied by phase differences on piezoelectric members at the respective divided regions, similarly divided metal electrode films must by formed. Further, in many case, the stator has a number of grooves or projections in a diameter direction in order to enlarge displacement. Such a complicated structure can easily be fabricated in the case of an ultrasonic motor having a diameter of several cm and therefore, there poses no problem. However, when a motor having a diameter equal to or smaller than 10 mm is desired, fine dimensional accuracy is required and the fabrication becomes considerably difficult with fabrication technologies currently used in the industry.

In order to resolve the above-described problem and realize a small-sized piezoelectric actuator having the diameter equal to or smaller than 10 mm, structures of an oscillator and a piezoelectric member may be constructed by a simple flat plate structure referred to as a unimorpl structure and there may be used a fabrication technology excellent in mass production performance of photolithography or etching.

However, as described on page 77 of the cited literature, according to the unimorph structure which is a simple structure of pasting together the oscillator and the piezoelectric member in the flat plate shape, there also poses a problem in which a flexural wave necessary for functioning the ultrasonic motor cannot be produced.

In order to resolve the above-described problem in the conventional technology, according to the invention, there is provided a method capable of producing a flexural wave even with the simple unimorph structure.

However, according to the above-described conventional micro piezoelectric motor 500 shown in FIG. 7, a flexural displacement mechanism unit 22 is oscillated at a primary mode and accordingly, there poses a problem in which produced torque is insufficient and a rotational number thereof is also small. Further description of the motor 500 is omitted here, reference being made to the detailed description of the motor 100 given hereinbelow.

SUMMARY OF THE INVENTION

Hence, the invention has been carried out in view of the above-described and it is an object of the invention to provide a piezoelectric actuator capable of providing sufficient torque and a large rotational number, a method of driving a piezoelectric actuator and a computer readable storage medium stored with a program for making a computer execute a method of driving a piezoelectric actuator.

In order to achieve the above-described object, according to a first aspect of the invention, there is provided a piezoelectric actuator comprising a moving member, a supporting member which is arranged oppositely to the moving member, one end of which is fixed to constitute a cantilever and other end of which is brought into contact with the moving member when the supporting member is oscillated, a piezoelectric member spread onto the supporting member and a power supply for supplying a voltage to the piezoelectric member to thereby oscillate the supporting member at a secondary mode or a higher mode.

When the supporting member is oscillated at the second mode or the higher mode, although an amplitude of oscillation is reduced, a component in the horizontal direction of the moving member is increased. Further, in order to produce the oscillation at the higher mode, a high resonance frequency in accordance therewith is requested and therefore, a number of bringing the supporting member into contact with the moving member is increased. Therefore, an amount of moving the moving member is increased and the torque is increased.

Further, according to a second aspect of the invention, there is provided a piezoelectric actuator comprising a moving member, a supporting member which is arranged oppositely to the moving member, one end of which is fixed to constitute a cantilever and other end of which is brought into contact with the moving member when the supporting member is oscillated, a piezoelectric member spread onto the supporting member and a power supply for supplying a power to the piezoelectric member to thereby make the supporting member execute an oscillation including a tertiary mode.

In this way, it is preferable to supply the piezoelectric member with the voltage for oscillating the supporting member at the tertiary mode. As described above, both the torque and the amount of moving are promoted in the case of the higher mode, it is difficult in view of the power supply and other constitution to oscillate the piezoelectric member at an excessively high mode. Further, both the torque and the amount of moving are larger in the case of the tertiary mode than in the case of the secondary mode. Therefore, the supporting member is made to be able to oscillate at a mode including at least the tertiary mode.

Further, according to a third aspect of the invention, there is provided the piezoelectric actuator wherein a frequency of the voltage supplied to the piezoelectric member falls in a range of 100 kHz through 1 MHz.

According to a size of a beam portion of a general micromotor, when voltage having a frequency of 100 kHz through 1 MHz is applied, oscillation at a higher mode can easily be provided.

Further, according to a fourth aspect of the invention, there is provided a piezoelectric actuator comprising a rotational moving member, an oscillator comprising supporting members each extended in a tangential line direction of an inner circle of the rotational moving member and having one fixed end and other free end and piezoelectric members pasted on the respective supporting members and a power supply for specifying a frequency of oscillating the supporting members at a higher mode based on a size and Young's modulus of each of the supporting members and supplying a voltage at the specified frequency to the piezoelectric members.

In an example of a rotational type, the frequency of the voltage supplied to the piezoelectric member is determined based on the size and Young's modulus of the supporting member. By oscillating the supporting member at the higher mode, large torque and rotational number can be provided to the rotational type piezoelectric actuator.

Further, according to a fifth aspect of the invention, there is provided a method of driving a piezoelectric actuator of constituting the piezoelectric actuator comprising a moving member, a supporting member which is arranged oppositely to the moving member, one end of which is fixed to constitute a cantilever and other end of which is brought into contact with the moving member in oscillating the supporting member and a piezoelectric member spread onto the supporting member, oscillating the supporting member by supplying a drive voltage to the piezoelectric member and driving the moving member by bringing the supporting member into contact with the moving member wherein a frequency of the drive voltage supplied to the piezoelectric member is set in a range of oscillating the supporting member at a secondary mode or a higher mode.

When the supporting member is oscillated at the second mode or the higher mode, although the amplitude of oscillation is reduced, the component in the horizontal direction of the moving member is increased. Further, in order to produce the oscillation at the higher mode, the higher resonance frequency is requested in accordance therewith and accordingly, the number of bringing the supporting member into contact with the moving member is increased. Therefore, the amount of moving the moving member is increased and the torque is increased.

Further, according to a sixth aspect of the invention, there is provided a method of driving a piezoelectric actuator of constituting the piezoelectric actuator comprising a moving member, a supporting member which is arranged oppositely to the moving member, one end of which is fixed to constitute a cantilever and other end of which is brought into contact with the moving member in oscillating the supporting member and a piezoelectric member spread onto the supporting member, oscillating the supporting member by supplying a drive voltage to the piezoelectric member and driving the moving member by bringing the supporting member into contact with the moving member wherein a frequency of a voltage supplied to the piezoelectric member is set to a range of making the supporting member execute an oscillation including a tertiary mode.

In this way, it is preferable to supply the voltage to the piezoelectric member such that the supporting member is oscillated at the tertiary mode. Although as described above, both the torque and the amount of moving are promoted further in the case of the higher mode, in order to oscillate the supporting member at an excessively high mode, the cost of the apparatus is increased in view of the power supply and other constitution and the driving efficiency is reduced.

Further, both the torque and the amount of moving are larger in the case of the tertiary mode than in the case of the secondary mode. Therefore, the supporting member is made to be able to oscillate at a mode including at least the tertiary mode.

Further, according to a seventh aspect of the invention, there is provided a computer readable storage medium, wherein the computer readable storage medium is stored with a program for making a computer execute the method of driving the piezoelectric actuator according to either of the above-described methods.

BRIEF DESCRIPTION OF THE DRAWINGS

FIG. 5 is a graph diagram representing a movement in respect of a frequency by admittance;

FIG. 8 is an explanatory view showing the operational principle of the micro piezoelectric motor shown in FIG. 7.

DETAILED DESCRIPTION OF THE PREFERRED EMBODIMENTS

A detailed explanation will be given of the invention in reference to the drawings as follows. Further, the invention is not limited by the embodiments.

Embodiment 1

Figure 1:
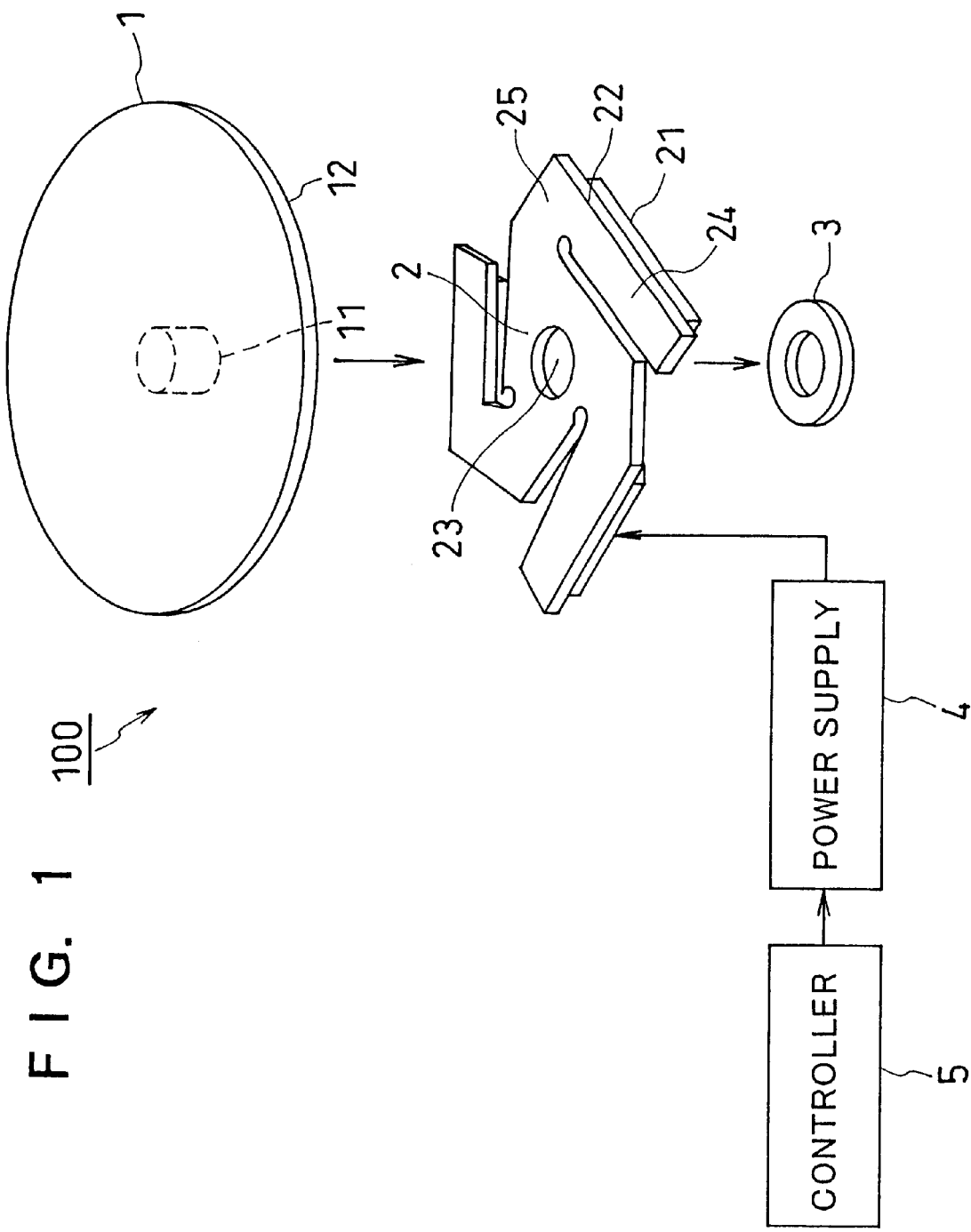
FIG. 1 is an assembly view showing a micro piezoelectric motor according to Embodiment 1 of the invention.

FIG. 1 is an assembly view showing a micro piezoelectric motor according to Embodiment 1 of the invention. The micro piezoelectric motor 100 is constituted by a rotational movement member 1 having a projected shaft portion 11, an oscillator block 2 having flexural displacement mechanism units 22 in an L-like shape spread with piezoelectric elements 21, a base chassis 3 supporting the projected shaft portion 11, a power supply 4 for applying drive voltage at a specific frequency on the piezoelectric elements 21 and a controller 5 for controlling the frequency of the power supply 4. Further, a magnet material for generating magnetic attraction force is used for the rotational movement member 1 and the base chassis 3 for bringing the rotational movement member 1 and the oscillator block 2 into contact with each other under constant pressure. For example, a stainless steel-species magnet material is used for the rotational movement member 1 and a neodymium-species magnet material is used for the base chassis 3. The base chassis 3 is attracted to a side of the rotational movement member by the magnet material and accordingly, stable tight contact performance is provided between a slidably moving portion 12 of the rotational movement member 1 and the flexural displacement mechanism unit 22 of the oscillator block 2. Further, it is preferable to use a nonmagnetic material for the oscillator block 2, particularly, the flexural displacement mechanism unit 22 to avoid to undergo influence of magnetic force of the magnet material.

The projected shaft portion 11 of the rotational movement member 1 is axially supported by a hollow shaft hole 23 of the oscillator block 2. Conversely, a hollow shaft hole may be provided to a side of the rotational movement member and a projected shaft portion may be provided to a side of the oscillator block. The slidably moving portion 12 of the rotational movement member 1 is a portion producing friction with the flexural displacement mechanism unit 22 and accordingly, it is preferable to use a material satisfying requests of large frictional coefficient, excellent wear resistance and being capable of maintaining stable frictional coefficient. For example, a main body of the rotational movement member 1 is formed by a metal or a resin-species material and an oxide film coating treatment is carried out on the slidably moving portion 12 of the oscillator block 2. Further, the slidably moving portion 12 may be formed by using composite materials of cellulose-species fiber, carbon-species fiber or whisker and phenolic resin or composite materials of cellulose-species fiber, carbon-species fiber or whisker with polyimide resin and polyamide resin.

Figure 2:
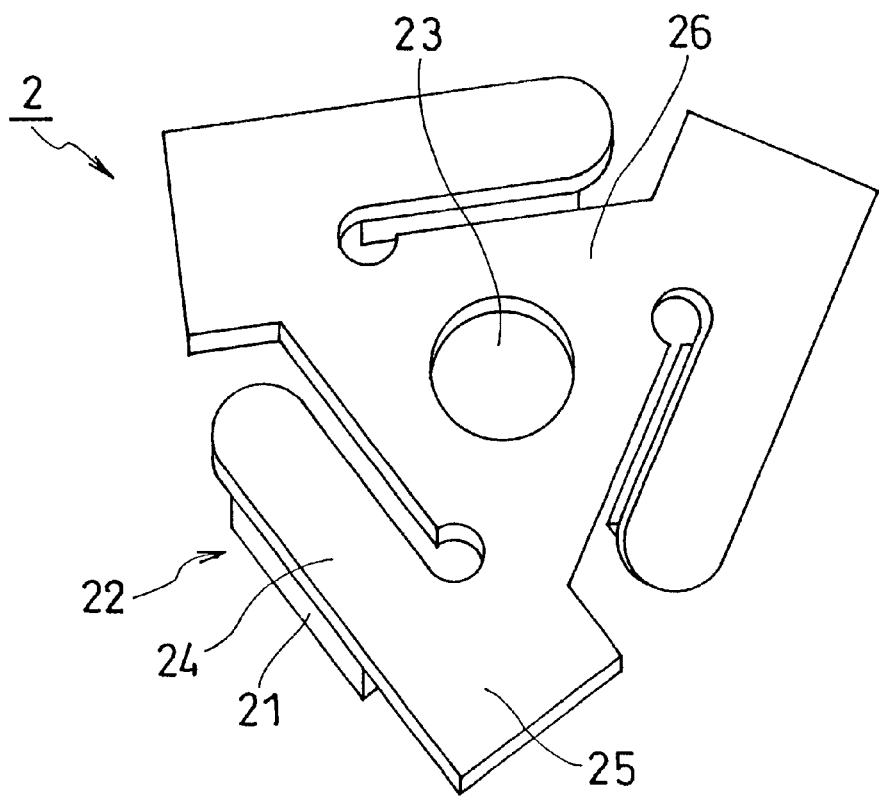
FIG. 2 is a perspective view showing a detailed structure of an oscillator block shown by FIG. 1.

FIG. 2 shows a detailed structure of the oscillator block 2. The flexural displacement mechanism units 22 are provided with a structure in which the piezoelectric elements 21 for producing elongating and contracting movement are spread on supporting members 24 and are formed in an L-like shape. A short side end portion 25 of the L-like shape is fixed to a central portion 26 of the block 2. The flexural displacement mechanism unit 22 is arranged to coincide with a tangential line direction of a circle incorporated in the sliding portion 12. A rotational direction of the rotational movement member 1 is determined by a direction of an elliptic motion drawn by a free end of the flexural displacement mechanism unit 22. In this case, owing to the constitution axially supporting the rotational movement member 1, when a motional locus of the flexural displacement mechanism unit 22 is made to coincide with a motional locus of the rotational movement member 1, motional transformation from the flexural displacement mechanism unit 22 to the rotational movement member 1 becomes efficient. Although in the drawing, the flexural displacement mechanism unit 22 is provided to project in the clockwise direction, when the projecting direction is inverted, the rotational movement member 1 is rotated in an inverted direction.

Further, torque and rotational speed of the micro piezoelectric motor 100 are determined by a distance from a rotational center of the flexural displacement mechanism unit 22 and a shape and a number of the flexural displacement mechanism units 22 provided to the oscillator block 2. A position of the flexural displacement mechanism unit 22, that is, the distance from the rotational center of the rotational movement member 1 to the rotational displacement mechanism unit 22 and the shape and the number of the flexural displacement mechanism unit 22 are set based on a requested specification of the micro piezoelectric motor.

The material selected for the piezoelectric body 21 is preferably a material providing a strain producing function, a resonating function and a voltage producing function. That is, the material preferably has a characteristic of producing stress or displacement in accordance with applied voltage, producing a resonating phenomenon in accordance with a frequency of the applied voltage and producing voltage in accordance with applied pressure. As the piezoelectric ceramic for the piezoelectric body 21, barium titanate or lead zircotitanate can be used. Further, in place of the piezoelectric ceramic, a crystalline material of lithium niobate or the like may be used. Materials such as elastic materials of metal-species or nonmetal-species of stainless steel, beryllium copper, phosphor bronze, brass, duralmin, titanium and silicon material may be used for the oscillator block 2.

It is preferable to use photo application technology such as etching or electrocasting in forming the rotational movement member 1 and the oscillator block 2. By using a nonmechanical forming process, deformation or stress and mechanical stress in forming the rotational movement member can be avoided. Further, because the parts are formed by high accuracy, integrating and adjusting steps of respective element parts can be minimized and function and reproducibility are stabilized.

Further, the supporting member 24 and the piezoelectric body 21 are integrated by adhesion. Conditions requested to such adhesion are that an adhering layer is very thin, that the adhering layer is hard and tough and that a resistance value at a vicinity of a resonance frequency is small after adhering the piezoelectric body 21 and the supporting member 24. For example, there is used a polymer adhering agent represented by hot melt and epoxy resin for the adhesion. Further, the piezoelectric body 21 may directly be bonded thereto without using an adhering agent. Further, the piezoelectric body 21 may be provided by processing means of thin film formation or thicken film formation. Further, as the flexural displacement mechanism unit 22, there are a unimorph type constituted by one sheet of the piezoelectric body 21, a bimorph type constituted by two sheets of piezoelectric elements and a multimorph type constituted by four sheets or more of piezoelectric elements and any type may be used. Materials of the piezoelectric body 21 and the supporting member 24 and a method of adhering these are set by a displacement amount, force, response performance and a structural restricting condition of the flexural displacement mechanism unit 22 requested to the micro piezoelectric motor 100.

Specifically, according to the oscillator block 2 shown by FIG. 2, the flexural displacement mechanism units 22 are constituted by three of the piezoelectric elements 21 and the flexural displacement mechanism units 22 are arranged uniformly along an outer periphery of the oscillator block 2. A diameter of the oscillator block 2 is about 2 mm. A diameter of the projected shaft portion 11 is 0.5 mm. The supporting members 24 of the flexural displacement mechanism units 22 are formed by etching austenitic stainless steel (SUS304).

Further, a thin film of lead zircotitanate having a high piezoelectric constant is used for the piezoelectric body 21. A bonding interface is produced between the supporting member 24 and the piezoelectric body 21 regardless of whether these are bonded directly or bonded by an adhering agent. The bonding interface constitutes an important factor for determining a propagation characteristic between the supporting member 24 and the piezoelectric body 21. Therefore, a characteristic of an adhering agent and film thickness control thereof become important. According to the example, an optimum film thickness is constituted by using an adhering agent of epoxy-species.

Figure 3:
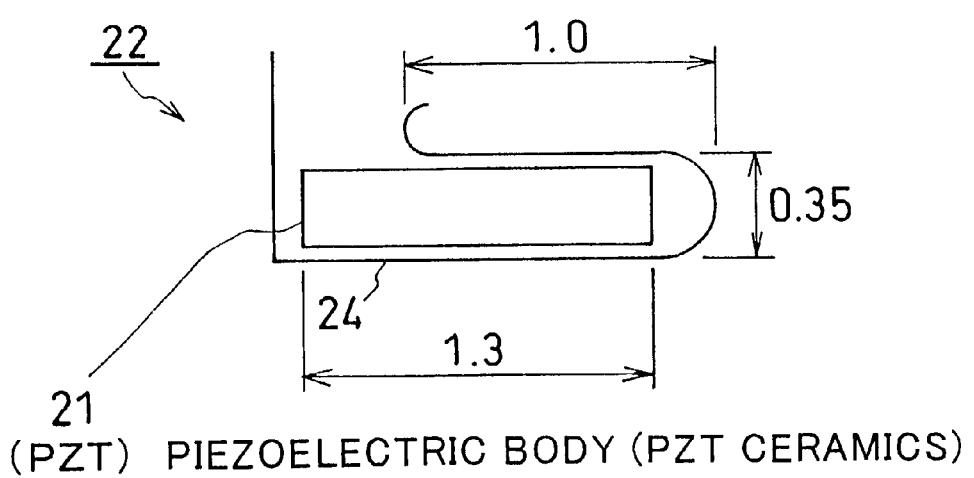
FIG. 3 is a detailed explanatory view of a flexural displacement mechanism unit.

Next, the shape of the flexural displacement mechanism unit 22 is set in consideration of the fact that there is a correlation between an effective length of the flexural displacement mechanism unit 22, particularly, a length between a fixed end to a free end thereof and displacement amounts of longitudinal motion and elliptical motion. Further, the natural frequency of the respective flexural displacement mechanism unit 22 depends on the shape and accordingly, the natural frequency is determined to comply with the specification from a result of s simulation model and experimental data. The shape of the oscillator block 2 according to the example is determined based on a diameter dimension of the desired micro piezoelectric motor 100 and a load condition of the rotational movement member 1. Specific dimensions of the flexural displacement mechanism unit 22 are shown by FIG. 3. A length of the free end of the supporting member 24 is 1.00 mm, a width thereof is 0.35 mm and a thickness thereof is 0.10 mm. Further, a length of the piezoelectric body 21 is 1.30 mm and a thickness thereof is 0.12 mm.

Further, a unimorph type constitution is adopted for the flexural displacement mechanism unit 22. Because there is provided a characteristic which is difficult to be accompanied by hysteresis in a displacement/voltage characteristic. Further, because although the displacement mount is small, the produced force is large in the case of the uniform type compared with the bimorph type and load and applied force on the rotational movement member 1 are pertinent. Further, depending on the specification of the micro piezoelectric motor 100, the multimorph type may be adopted and the displacement and the force can be increased by increasing a number of layers while maintaining the thickness constant. Further, the response performance can also be promoted by tapering the flexural displacement mechanism unit from a fixed end thereof to a free end thereof. According to the oscillator block 2 having such a constitution, flexural displacement of the flexural displacement mechanism unit 22 can be excited extremely stably. Further, arrangement, shape, number and constitution of the flexural displacement mechanism units 22 of the oscillator block 2 are not limited to those in the example shown by FIG. 2.

Operational principle of the micro piezoelectric motor 100 has been explained in the above-described conventional example and accordingly, an explanation thereof will be omitted (refer to FIG. 8). The micro piezoelectric motor 100 according to the present invention differs from the micro piezoelectric motor 500 of the above-described conventional example in the setting of the frequency of the power supply. The applied voltage and the frequency of the power supply. The applied voltage and the frequency inputted to the flexural displacement mechanism unit 22 are adjusted based on dimensions, shape and Young's modulus of the flexural displacement mechanism unit 22. A maximum amplitude of the flexural displacement mechanism unit 22 is provided by setting an input signal to a vicinity of the resonance frequency.

In this case, for example, a personal computer or a one chip type micro computer can be used for the above-described controller 5. A storage medium used for the personal computer or the micro computer is stored with a program in which the applied voltage and the frequency inputted to the piezoelectric body 21 can be set based on dimensions, shape and Young's modulus of the flexural displacement mechanism unit.

Figure 4:
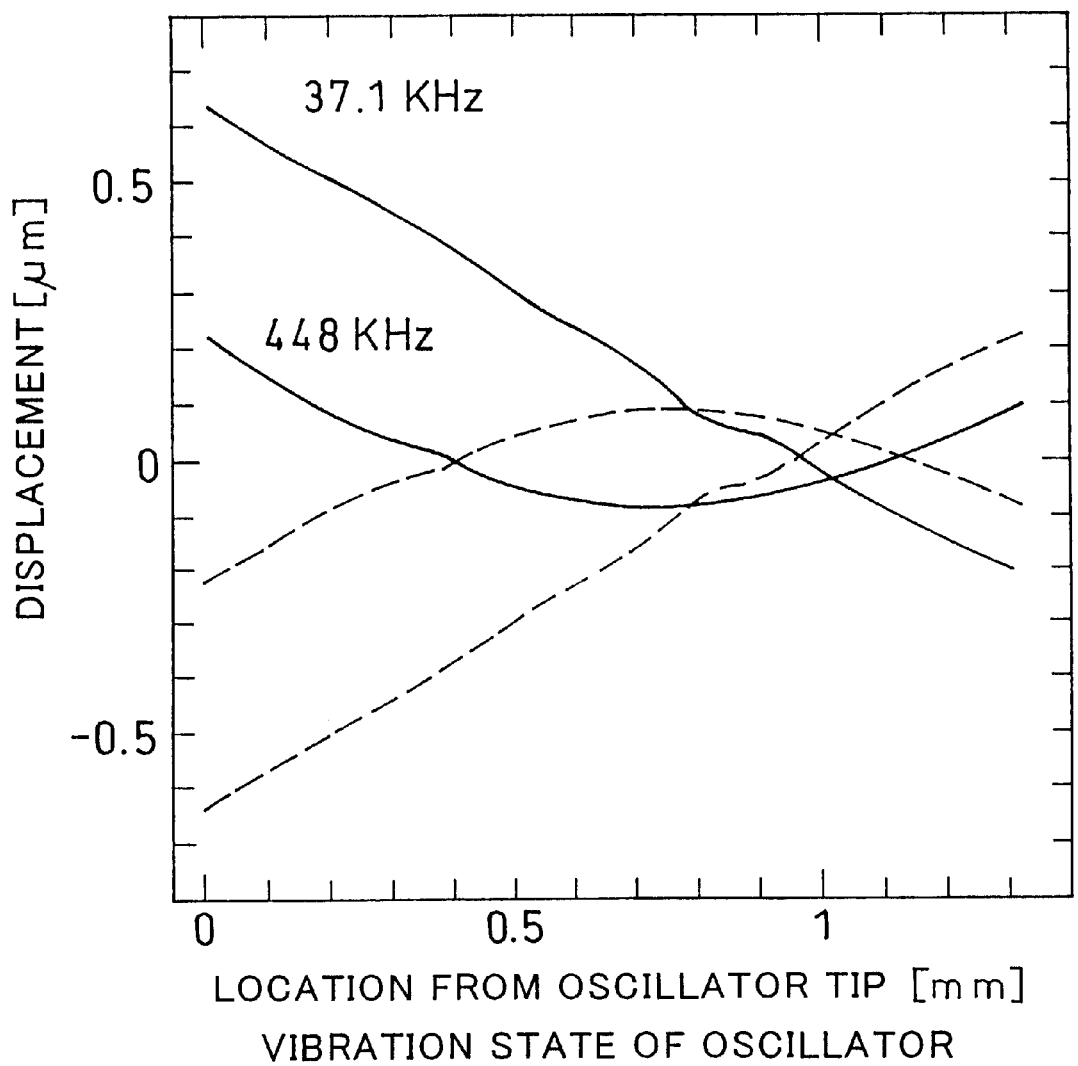
FIG. 4 is a graph diagram showing a behavior of the flexural displacement mechanism unit at predetermined frequencies.
Figure 6:
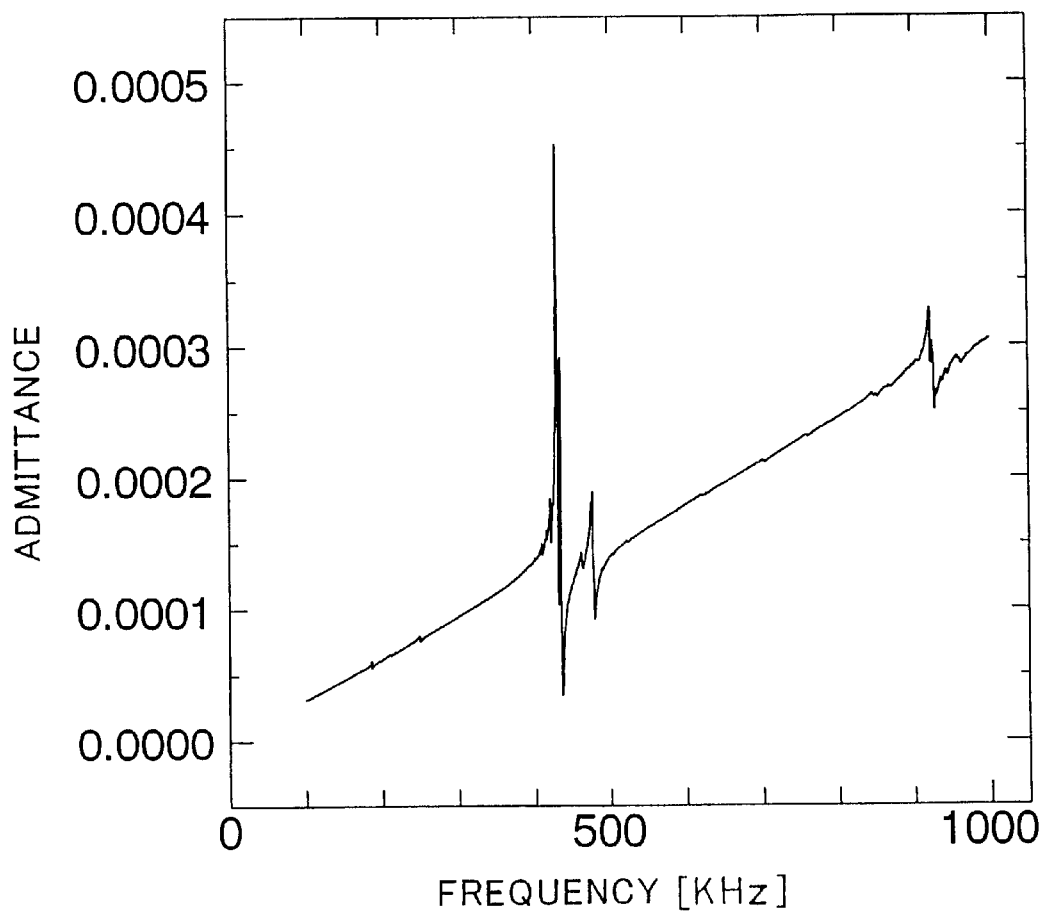
FIG. 6 is a graph diagram representing a movement in respect of a frequency by admittance.
Figure 7:
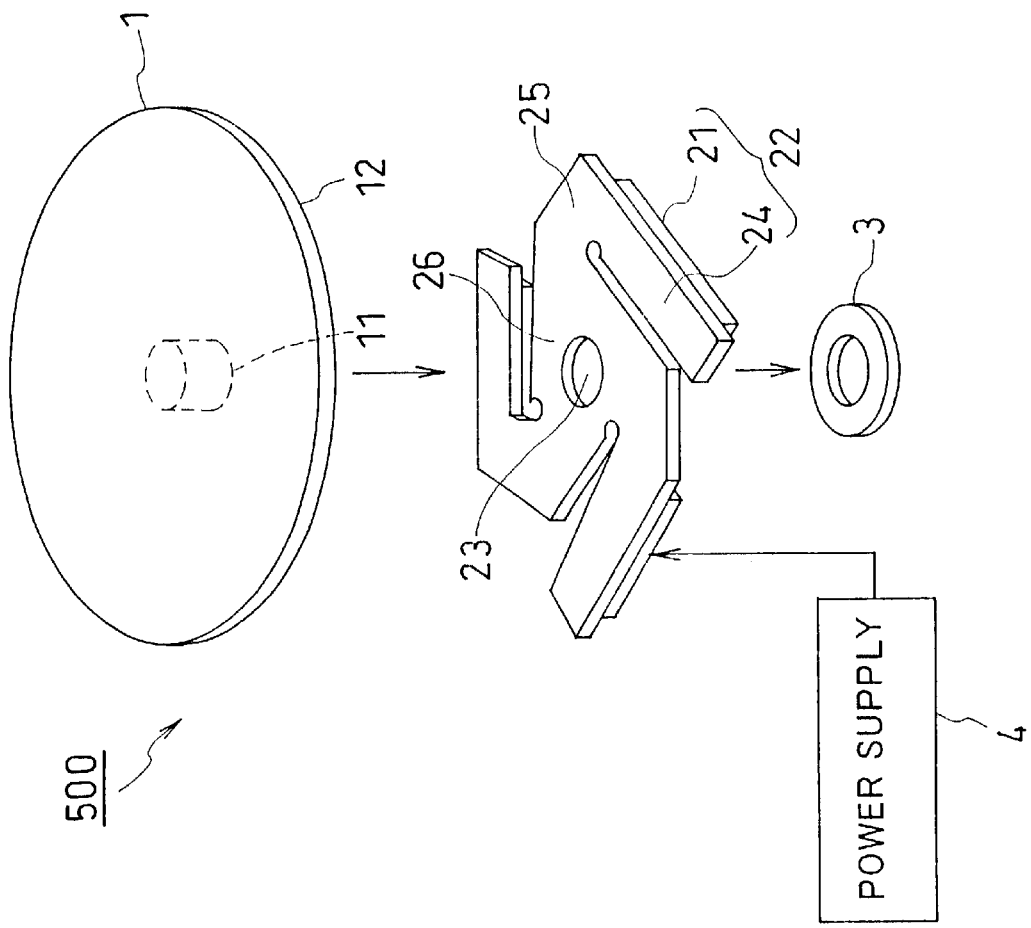
FIG. 7 is an assembly view showing a conventional micro piezoelectric motor.

FIG. 4 is a graph diagram showing a behavior of the flexural displacement mechanism unit 22 at predetermined frequencies. The abscissa designates a distance from a front end of the flexural displacement mechanism unit and the ordinate designates a displacement mechanism unit 22. It has been found as a result of experiment that when a drive voltage at a frequency of 37.1 kHz is applied on the piezoelectric body 21, the flexural displacement mechanism unit 22 is oscillated in a primary mode and the displacement amount is maximized. It has been found as a result of further experimentation that by applying drive voltage at a frequency of 448 kHz on the piezoelectric body 21, the flexural displacement mechanism unit 22 is oscillated at a tertiary mode and the rotational number of the rotational movement member 1 is maximized. Further, the displacement amount of the flexural displacement mechanism unit 22 is measured by using the laser doppler method. FIG. 5 and FIG. 6 are graph diagrams showing a relationship between the frequency of the applied voltage and admittance. The admittance is measured by an impedance analyzer. The more the rotational movement member 1 is moved, the larger the admittance. As shown by FIG. 5, at the frequency of 37.1 kHz, oscillation at the primary mode is excited and a peak of admittance emerges. Further, as shown by FIG. 6, at the frequency of 448 kHz, oscillation at a secondary mode is excited and at a frequency of 922 kHz, oscillation at a tertiary mode is exerted and peaks of admittance emerge.

Further, although according to the above-described embodiment an explanation has been given of a micro piezoelectric motor constituting an example of the piezoelectric actuator, the technology of the present invention is applicable not only to the above-described rotational type piezoelectric actuator but also to a piezoelectric actuator of a linear type.

As has been explained, according to the first aspect of the invention, there is provided a piezoelectric actuator comprising a moving member, a supporting member which is arranged opposedly to the moving member, one end of which is fixed to constitute a cantilever and other end of which is brought into contact with the moving member when the supporting member is oscillated, a piezoelectric member spread onto the supporting member and a power supply for supplying a voltage to the piezoelectric member to thereby oscillate the supporting member at a secondary mode or a higher mode. Therefore, when the component in the horizontal direction of the moving member is increased, the number of times of bringing the supporting member with the moving member is increased and accordingly, the movement amount of the moving member is increased and the torque is increased.

Further, according to the second aspect of the invention, there is provided a piezoelectric actuator comprising a moving member, a supporting member which is arranged opposedly to the moving member, one end of which is fixed to constitute a cantilever and other end of which is brought into contact with the moving member when the supporting member is oscillated, a piezoelectric member spread onto the supporting member and a power supply for supplying a power to the piezoelectric member to thereby make the supporting member execute an oscillation including a tertiary mode. Therefore, when the component in the horizontal direction of the moving member is increased, the number of times of bringing the supporting member with the moving member is increased and therefore, the movement amount of the movement member is increased and the torque is increased. Further, when the increase in the movement amount and the increase in the torque can be achieved by providing oscillation at least in the tertiary mode to the supporting member.

Further, according to the third aspect of the invention, there is provided the piezoelectric actuator wherein a frequency of the voltage supplied to the piezoelectric member falls in a range of 100 kHz through 1 MHz. Therefore, oscillation at the higher mode can easily be provided. As a result, the movement amount and the torque can easily be increased.

Further, according to the fourth aspect of the invention, there is provided a piezoelectric actuator comprising a rotational moving member, an oscillator comprising supporting members each extended in a tangential line direction of an inner circle of the rotational moving member and having one fixed end and other free end and piezoelectric members pasted on the respective supporting members and a power supply for specifying a frequency of oscillating the supporting members at a higher mode based on a size and Young's modulus of each of the supporting members and supplying a voltage at the specified frequency to the piezoelectric members. Therefore, by oscillating the supporting members at the higher mode, large torque and rotational number can be provided by the piezoelectric actuator or a rotational type.

Further, according to the fifth aspect of the invention, there is provided a method of driving a piezoelectric actuator having a moving member, a supporting member which is arranged opposedly to the moving member, one end of which is fixed to constitute a cantilever and other end of which is brought into contact with the moving member to oscillate the supporting member, and a piezoelectric member spread onto the supporting member, the method comprising the steps of oscillating the supporting member by supplying a drive voltage to the piezoelectric member and driving the moving member by bringing the supporting member into contact with the moving member, wherein a frequency of the drive voltage supplied to the piezoelectric member is set in a range of oscillating the supporting member at a secondary mode or a higher mode. Therefore, the component in the horizontal direction of the moving member is increased and the number of times of bringing the supporting member into contact with the moving member is increased and accordingly, the movement amount of the moving member is increased and the torque is increased.

Further, according to the sixth aspect of the invention, there is provided a method of driving a piezoelectric actuator having a moving member, a supporting member which is arranged opposedly to the moving member, one end of which is fixed to constitute a cantilever and other end of which is brought into contact with the moving member to oscillate the supporting member, and a piezoelectric member spread onto the supporting member, the method comprising the steps of oscillating the supporting member by supplying a drive voltage to the piezoelectric member and driving the moving member by bringing the supporting member into contact with the moving member, wherein a frequency of a voltage supplied to the piezoelectric member is set to a range of making the supporting member execute an oscillation including a tertiary mode. Therefore, the component in the horizontal direction of the moving member is increased and the number of times of bringing the supporting member into contact with the moving member is increased. Therefore, the movement amount of the moving member is increased and the torque is increased. Further, by providing oscillation at least the tertiary mode to the supporting member, the increase of moving amount and torque can be achieved.

Further, according to the seventh aspect of the invention, there is provided a computer readable storage medium, wherein the computer readable storage medium is stored with a program for making a computer execute the method of driving the piezoelectric actuator. Therefore, by executing such a program by the computer, the movement amount and the torque of the piezoelectric actuator can be increased.

What is claimed is:

1. A piezoelectric actuator comprising:
   a rotational moving member;
   a supporting member disposed opposite to the rotational moving member, the supporting member having a plurality of cantilevers each having a fixed end and a free end opposite to the fixed end for contacting the rotational moving member when the supporting member is oscillated;
   a plurality of piezoelectric members each disposed on a respective one of the cantilevers of the supporting member; and
   a power source for supplying a voltage to each of the piezoelectric members to oscillate the supporting member in a vibration mode higher than a secondary mode of vibration so that the free ends of the cantilevers make sufficient contact with the rotational moving member to thereby rotate the rotational moving member.

2. A piezoelectric actuator according claim 1; wherein the voltage supplied to each of the piezoelectric members by the power source has a frequency in the range of 100 kHz to 1 Mhz.

3. A piezoelectric actuator according to claim 1; wherein the rotational moving member is generally circular-shaped; and wherein each of the cantilevers extends tangentially to an inner circle of the rotational moving member.

4. A piezoelectric actuator according to claim 1; wherein the piezoelectric members are adhered to the cantilevers of the supporting member.

5. A piezoelectric actuator according to claim 1; wherein the voltage applied to each of the piezoelectric members by the power source is the same.

6. A piezoelectric actuator comprising: a rotational moving member; a supporting member disposed opposite to the rotational moving member, the supporting member having a plurality of cantilevers each having a fixed end and a free end opposite to the fixed end for contacting the rotational moving member when the supporting member is oscillated; a plurality of piezoelectric members each disposed on a respective one of the cantilevers of the supporting member; and a power source for supplying a voltage to each of the piezoelectric members to oscillate the supporting member in a tertiary mode of vibration so that the free ends of the cantilevers make sufficient contact with the rotational moving member to thereby rotate the rotational moving member.

7. A piezoelectric actuator according to claim 6; wherein the rotational moving member is generally circular-shaped; and wherein each of the cantilevers extends tangentially to an inner circle of the rotational moving member.

8. A piezoelectric actuator according to claim 6; wherein the piezoelectric members are adhered to the cantilevers of the supporting member.

9. A piezoelectric actuator according to claim 6; wherein the voltage applied to each of the piezoelectric members by the power source is the same.

10. A method of driving a piezoelectric actuator, comprising the steps of: providing a piezoelectric actuator having a rotational moving member, a supporting member disposed opposite to the rotational moving member and having a plurality of cantilevers each having a fixed end and a free end opposite to the fixed end for contacting the rotational moving member, and a plurality of piezoelectric members each disposed on a respective one of the cantilevers; and supplying a voltage to each of the piezoelectric members to oscillate the supporting member in a vibration mode higher than a secondary mode of vibration so that the free ends of the cantilevers make sufficient contact with the rotational moving member to thereby rotate the rotational moving member.

11. A method according to claim 10; wherein the providing step includes providing a generally circular-shaped rotational moving member and a plurality of cantilevers extending tangentially to an inner circle of the rotational moving member.

12. A method according to claim 10; further comprising the step of adhering each of the piezoelectric members on a respective one of the cantilevers.

13. A method according to claim 10; wherein the supplying step comprises supplying the same voltage to each of the piezoelectric members.

14. A method according to claim 10; wherein the supplying step comprises supplying a voltage having a frequency in the range of 100 kHz to 1 Mhz.

15. A method according to claim 10; wherein the supplying step comprises supplying a voltage to each of the piezoelectric members to oscillate the supporting member in a tertiary mode of vibration so that the free ends of the cantilevers are brought into contact with the rotational moving member to thereby rotate the rotational moving member.

16. A computer readable storage medium having stored therein a computer program for executing the method of driving the piezoelectric actuator according to claim 15.

17. A computer readable storage medium having stored therein a computer program for executing the method of driving the piezoelectric actuator according to claim 10.

18. A piezoelectric actuator comprising: a rotational moving member for undergoing rotation; an oscillator block having a generally central portion and a plurality of cantilever portions extending from the central portion, each of the cantilever portions having a fixed end connected to the central portion and a free end; a plurality of piezoelectric members each disposed on a respective one of the cantilever portions of the oscillator block; means for maintaining the rotational moving member and the oscillator block under constant pressure; and voltage applying means for applying a voltage to each of the piezoelectric members to oscillate the oscillator block in a vibration mode higher than a secondary mode of vibration so that the free ends of the cantilever portions are brought into contact with the rotational moving member to thereby rotate the rotational moving member.

19. A piezoelectric actuator according to claim 18; wherein the voltage applying means includes means for applying the same voltage to each of the piezoelectric members.

20. A piezoelectric actuator according to claim 18; wherein the voltage applying means includes means for applying a voltage to each of the piezoelectric members to oscillate the oscillator block in a vibration mode higher than a secondary mode of vibration so that the free ends of the cantilever portions are brought into contact with the rotational moving member to thereby rotate the rotational moving member.

* * * * *